(12) United States Patent
Norell (10) Patent No.: US 7,687,777 B2
(45) Date of Patent: Mar. 30, 2010

(54) APERTURE ASSEMBLY FOR USE WITH A PHOTOSENSOR SYSTEM AND A SECURING MECHANISM FOR THE APERTURE ASSEMBLY

(75) Inventor: Neil N. Norell, Endicott, NY (US)

(73) Assignee: Shop Vac Corporation, Williamsport, PA (US)

( * ) Notice: Subject to any disclaimer, the term of this patent is extended or adjusted under 35 U.S.C. 154(b) by 196 days.

(21) Appl. No.: 11/872,918

(22) Filed: Oct. 16, 2007

(65) Prior Publication Data

US 2009/0097102 A1    Apr. 16, 2009

(51) Int. Cl.
*G01J 5/02* (2006.01)
*G02B 13/14* (2006.01)

(52) U.S. Cl. .................... 250/353; 250/338.1; 359/298; 359/350; 359/355; 359/894

(58) Field of Classification Search .............. 250/338.1, 250/353; 359/298, 350, 355, 894
See application file for complete search history.

(56) References Cited

U.S. PATENT DOCUMENTS

| | | | |
|---|---|---|---|
| 4,920,341 | A | 4/1990 | Aoki et al. |
| 4,970,579 | A | 11/1990 | Arldt et al. |
| 5,603,231 | A | 2/1997 | Abraham |
| 5,737,188 | A | 4/1998 | Flierl et al. |
| 5,877,568 | A | 3/1999 | Maes et al. |
| 5,934,019 | A | 8/1999 | Rotharmel et al. |
| D416,487 | S * | 11/1999 | Shapiro .................. D9/432 |
| 6,029,510 | A | 2/2000 | Nakaie et al. |
| 6,354,162 | B1 | 3/2002 | Bobay et al. |

FOREIGN PATENT DOCUMENTS

GB        985184       3/1965

OTHER PUBLICATIONS

International Search Report and Written Opinion for Application No. PCT/US08/075664 dated Mar. 27, 2009.
"SDP8406-002, SDP Series Photo Transistor, Side-looking Plastic Package," Honeywell, http://catalog.sensing.honeywell.com, 5 pages, accessed Nov. 28, 2005.

(Continued)

*Primary Examiner*—David P Porta
*Assistant Examiner*—Casey Bryant
(74) *Attorney, Agent, or Firm*—Marshall, Gerstein & Borun LLP (57) ABSTRACT

A cost-effective photosensor system for rotor position detection includes securing an aperture assembly to an off-the-shelf infrared radiation-emitting component and/or an off-the-shelf infrared radiation-detecting component. The application discloses an aperture assembly that may be stamped from a thin, opaque, elongated piece of plastic having an aperture window through which a radiation beam may pass and be focused. The aperture assembly also has a locking system for securing the assembly to the off-the-shelf photosensor system component, and an alignment system to direct the infrared radiation beam. A replaceable stamped aperture assembly for use in a rotor-sensing system and a method of providing a replaceable aperture assembly and securing it to an infrared component of a photosensor system are also disclosed.

19 Claims, 8 Drawing Sheets

OTHER PUBLICATIONS

"HOA1887, Transmissive Sensor," Honeywell, http://content.honeywell.com/sensing/prodinfo.infrared/catalog/Pg_338.pdf, pp. 338-341, accessed by inventor on Oct. 25, 2004.

"SEP8506, GaAs Infrared Emitting Diode," Honeywell, http://content.honeywell.com/sensing/prodinfo/infrared/catalog/Pg_40.pdf, pp. 40-43, believed to be accessed by the inventor on Oct. 25, 2004.

"Infrared Emitting Diodes," Bright LED Electronics Corp., http://web.archive.org/web/20050306143545/http://www.brtled.com/Esales.htm, 2 pages, Internet archive dated Mar. 2005, accessed Sep. 9, 2009.

* cited by examiner

APERTURE ASSEMBLY FOR USE WITH A PHOTOSENSOR SYSTEM AND A SECURING MECHANISM FOR THE APERTURE ASSEMBLY

TECHNICAL FIELD

The present disclosure relates generally to an aperture assembly for a photosensor system for use in a rotor-sensing system in a switched reluctance motor and a securing mechanism for the aperture assembly.

BACKGROUND

A switched reluctance or brushless motor is an electrical motor that includes a rotor and a stator. Torque in a reluctance motor is produced by the tendency of the rotor to move to a position relative to the stator in which the reluctance of a magnetic circuit is minimized, i.e., a position in which the inductance of an energized stator winding is maximized. In a switched reluctance motor, circuitry detects the angular position of the rotor and sequentially energizes phases of the stator windings as a function of rotor position.

A common circuitry device used for rotor orientation/position detection is a photosensor, or transmissive, sensor system. A photosensor system includes an infrared radiation (IR) emitting component aligned across a gap with an infrared radiation (IR) detecting component. The IR emitting component may employ LED technology, and the IR detecting component may be a phototransistor or a photodiode. The photosensor system is positioned inside the motor so that as the rotor moves, an encoder crosses through the gap between the IR components. Radiation is thus blocked by the encoder over a short time interval. The photosensor system electronically communicates this information to the control system of the motor. The control system of the motor may then use the data for determining the rotor speed and position and energize phases of stator windings accordingly. Apertures on one or both of the IR emitting and IR detecting components may be used to focus the radiation beam to obtain precise measurements. Multiple photosensor systems may be used for rotor-sensing to provide detailed feedback to the control system of the motor.

In a switched reluctance motor, a typical photosensor system may include an "all-in-one" unit for both of the IR components. These units contain the IR emitting or IR detecting element (LED, phototransistor, photodiode, etc.) surrounded by an injection molded assembly. The injection molded assembly is manufactured with an aperture slot configured at an appropriate position to allow the infrared radiation to pass through. The assembly has a mounting mechanism to attach the unit to the motor housing as well as electrical connections to provide a communication path to the control system of the motor. One example of an "all-in-one" unit of a photosensor system used in switched reluctance motors is the Honeywell™ P/N HOA1887 transmissive sensor.

Companies that manufacture switched reluctance motors are constantly searching for ways to decrease costs and increase profitability. Finding a more cost effective way to provide the photosensor system function in a brushless motor may enhance the bottom line of the company.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Instead of utilizing an "all-in-one" injection molded photosensor system for rotor position detection, a more cost-effective alternative may include securing a stamped aperture assembly to an off-the-shelf IR emitting component and/or an off-the-shelf IR detecting component. The aperture assembly may be stamped from a thin, opaque, elongated piece of plastic having an aperture window through which a radiation beam may pass, a locking system for securing the assembly to the off-the-shelf photosensor system component, and an alignment system to focus the infrared radiation beam.

The stamped aperture assembly may be fashioned from a thin, opaque, elongated sheet of plastic, typically a polycarbonate film, wrapped around the IR component with the aid of transversely oriented coined fold lines. The wrapping may begin at the pin-holding face of the IR component, pass over the dome of the IR component, cross the pin-opposite face, and cross the dome-opposite face back to the pin-holding face. Polycarbonate film may be an exemplary choice of material to minimize costs for several reasons. A common stock thickness of the film may allow the material to be folded on the coined lines around the IR component without breakage. The material may shield infrared light by a large percentage (approximately 95%), and the material may allow for hand assembly. A smooth finish of the polycarbonate film may aid in uniformity of the aperture assembly during processing through a stamping die. Of course, other choices of material having similar characteristics may be used.

The aperture window may consist of a narrow slit in the aperture assembly parallel to the direction of the wrapping, i.e., parallel to the length of the sheet of plastic. Its location on the sheet of plastic may be such that the emitted/detected radiation beam passes through the aperture window. The length of the aperture window may be at least the diameter of the dome of the off-the-shelf photosensor component under which the emitter/detector is positioned. The width of the aperture window may correspond to the desired precision of the optical sensing required. The width of the sheet of plastic at the aperture window may be such that the radiation beam is not able to pass around the edges of the plastic. Thus, the beam may only pass through the aperture window to reach the other IR component.

One embodiment of the locking system of the aperture assembly may include a pin slot and a sagitally-shaped locking tab at either end of the sheet of plastic. The pin slot may be configured to slide over and receive the pins of the IR component securely. When the pins are received by the pin slot and the aperture assembly is wrapped around the IR component, the internal face of the locking tab may be flush with the external face of the pin slot at the pin-holding face. The shaft of the locking tab may pass between the pins of the IR component, and the head of the tab may rest on the pins, thus securing the aperture assembly to the IR component. Other embodiments of a locking system are also possible.

One embodiment of the alignment system of the aperture assembly may include a locator slot. The locator slot may be positioned so that when the pin slot receives the pins of the IR component and the sheet of plastic is wrapped around the IR component, the edge created by the intersection of the pin-opposite face and the dome-opposite face of the IR component may pass through the locator slot and may be received securely. The locator slot receiving the edge securely may result in the aperture assembly being positioned so that the aperture window is aligned over the dome of the IR component. Wrapping may be continued to secure the aperture assembly by engaging the locking system. In this manner, the locator slot may prevent the aperture assembly from sliding off of the IR component, and may allow the aperture window to be aligned properly. Of course, other embodiments of an alignment system are possible.

An exemplary positioning of the locked aperture assembly may have the pin slot receiving the IR component pins, the pin slot flush against the pin-holding face of the IR component, the aperture window tangential to the dome-holding face, the locking slot securely receiving the edge created by the intersection of the pin-opposite and dome-opposite faces, the sheet of plastic wrapped flush against the dome-opposite face, and the locking tab flush against the pin slot.

The stamped aperture assembly may be secured to an off-the-shelf infrared radiation emitting component, it may be secured to an off-the-shelf infrared radiation detecting component, or it may be secured to both IR components. In one embodiment, an infrared radiation-emitting component such as an infrared emitting diode may be used, and an infrared radiation-detecting component such as a photodiode or phototransistor may be used. The use of the stamped aperture assembly with these IR components in this embodiment may result in a rotor orientation/position detection system with a similar capability as an "all-in-one" injection molded unit, but with substantial cost savings. Other embodiments using other IR components may also be possible.

DETAILED DESCRIPTION

Although the following text sets forth a detailed description of numerous different embodiments, it should be understood that the legal scope of the invention is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

It should also be understood that, unless a term is expressly defined in this patent using the sentence "As used herein, the term '________' is hereby defined to mean . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

Figure 1:
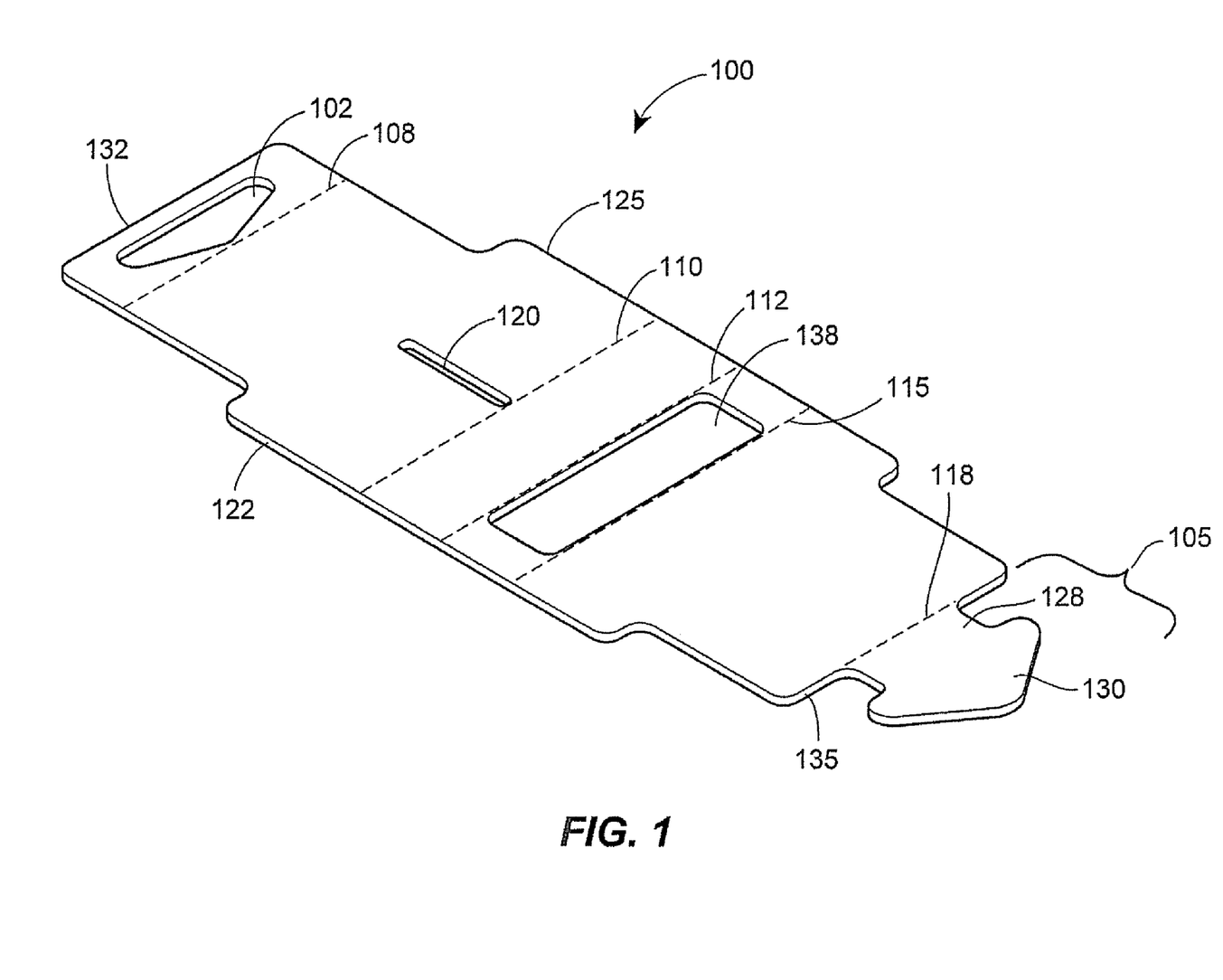
FIG. 1 is an exemplary embodiment of an aperture assembly for a photosensor system for use in a rotor-sensing system in a switched reluctance motor and a securing mechanism for the aperture assembly.

FIG. 1 is an exemplary embodiment of an aperture assembly 100 for a photosensor system for use in a rotor-sensing system in a switched reluctance motor, and a securing mechanism 102, 105 for attaching the aperture assembly to the photosensor system. The aperture assembly 100 may be stamped from a thin, opaque, elongated sheet of plastic. The sheet of plastic may have one or more transversely oriented coined fold lines 108, 110, 112, 115, 118 to enable the aperture assembly to be wrapped around an IR emitting or an IR detecting component of the photosensor system. The IR emitting component may be an LED or some other similar component. The IR detecting component may be a photodiode, phototransistor, or some other similar component.

The material from which the sheet of plastic is stamped may have several characteristics needed for an aperture assembly 100. First, the material may have a thickness such that the aperture assembly 100 may be wrapped around the IR component (using the coined fold lines 108, 110, 112, 115, 118) without breaking. Also, the material may be capable of filtering at least 90% of the radiation emitted by the radiation-emitting component. The material may have a smooth finish to enable uniformity of the aperture assembly 100 during processing through a stamping die, and the material may allow for hand assembly. An exemplary choice of material may be a polycarbonate film, such as GE 8020MA701. Its thickness (approximately 0.25 mm+/−0.03 mm), opaqueness, and other such characteristics meet the parameters of a suitable material for use as an aperture assembly 100. Of course, other choices of material are possible.

The aperture assembly 100 may have an aperture window 120 for focusing infrared radiation of the photosensor system. The aperture window 120 may have an orientation parallel to the length of the aperture assembly 100. Its length may be at least as long as the diameter of a dome of a photosensor IR component, and its width may correspond to a desired precision of optical sensing by the photosensor system. The width of the sheet of plastic along the length of the aperture window is such that the infrared radiation emitted/detected by the photosensor system may only pass through the aperture window 120 and not around the sides 122, 125 of the aperture assembly.

Figure 3:
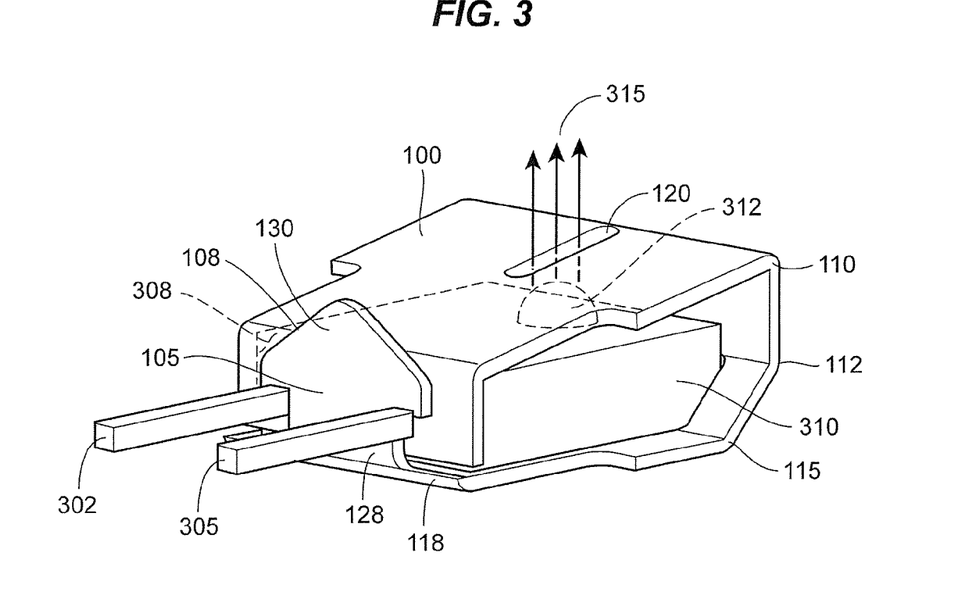
FIG. 3 shows a transparent view of an exemplary positioning of the wrapped and secured aperture assembly.

The aperture assembly 100 may be secured to an IR component of the photosensor by using a locking system. An exemplary embodiment 102, 105 of the locking system has a pin slot 102 and a sagitally-shaped locking tab 105 with a shaft 128 and a head 130. The pin slot 102 may be located at one end 132 of the aperture assembly 100, and may be shaped to securely receive the pins of the IR component. The locking tab 105 may be located at the opposite end 135 of the aperture assembly 100. FIG. 3 illustrates how the locking system 102, 105 may be engaged. The pin slot 102 (not visible) may receive the pins 302, 305 of the IR component and may be positioned flush against the pin-holding face 308 of the IR component 310. The aperture assembly 100 may be wrapped around the IR component, resulting in the locking tab 105 overlapping the pin slot 102, with the shaft 128 of the locking tab positioned between the pins 302, 305 and the head 130 resting on the side of the pins opposite of the shaft 128. Other embodiments for the locking system may be possible.

Figure 2A:
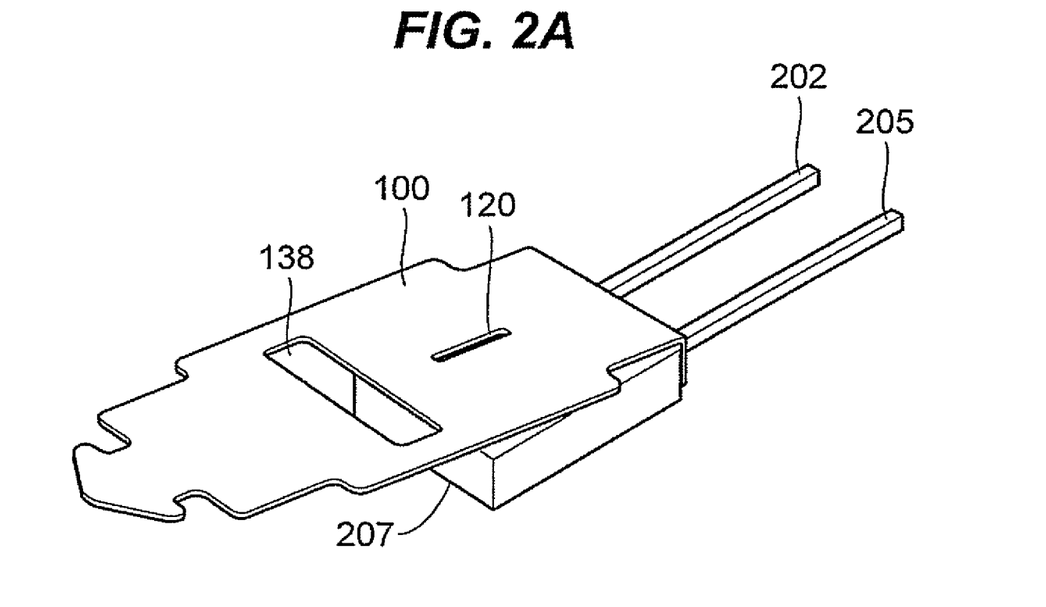
FIG. 2a illustrates the exemplary embodiment of an aperture assembly partially wrapped around an IR component of the photosensor system.
Figure 2B:
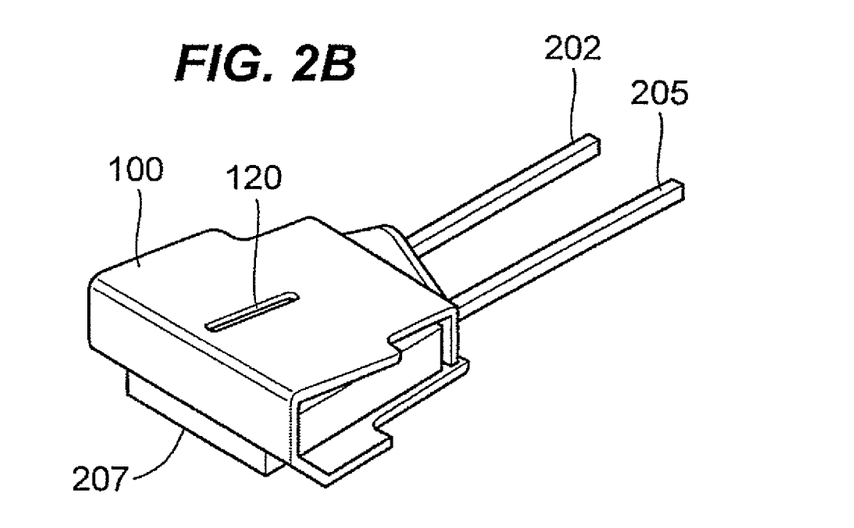
FIG. 2b illustrates the exemplary embodiment of an aperture assembly fully wrapped around and secured to an IR component of the photosensor system.

Turning back to FIG. 1, the aperture assembly 100 may have an alignment system for positioning the aperture window 120 over the dome of the IR component. An exemplary embodiment of an alignment system has a locator slot 138 configured and sized to receive securely the edge created by the intersection of the pin-opposite face and dome-opposite face of the IR component. FIGS. 2a and 2b illustrate the usage of the locator slot 138 in an aperture assembly 100. In FIG. 2a, the pins 202, 205 are received by the pin slot 102 (not visible) and the aperture assembly 100 is partially wrapped. The aperture window 120 is over the dome of the IR component (not visible). The locator slot 138 has not yet received the edge 207. In FIG. 2b, the aperture assembly 100 is fully wrapped with the edge 207 received by and protruding through the locator slot 138 (not visible), thus centering the aperture window 120 over the dome (not visible) and securing its alignment. Of course, other embodiments of an alignment system may also be possible.

FIG. 3 shows a transparent view of an exemplary positioning of the wrapped and secured aperture assembly 100. The pin slot 102 (not visible) may receive the pins 302, 305 of the IR component 310 and may be flush against the pin-holding face 308 of the IR component 310. Coined fold line 108 may be activated and the aperture window 120 may be aligned over the dome 312 of the IR component 310 so that infrared radiation 315 may pass through the aperture window 120. Coined fold lines 110, 112, and 115 may be activated so that the edge 207 (not visible) created by the intersection of the pin-opposite face and dome-opposite face of the IR component 310 may be securely received by and may protrude through the locator slot 138 (not visible). The aperture assembly 100 may continue flush with the dome-opposite face of the IR component (not visible). Coined fold line 118 may be activated and the shaft 128 of the locking tab 105 may be positioned between the pins 302, 305 of the IR component 310, flush against the external face of the pin slot 102 (not visible). The head 130 of the locking tab 105 may rest on the side of the pins 302, 305 opposite to the shaft 128.

Figure 4:
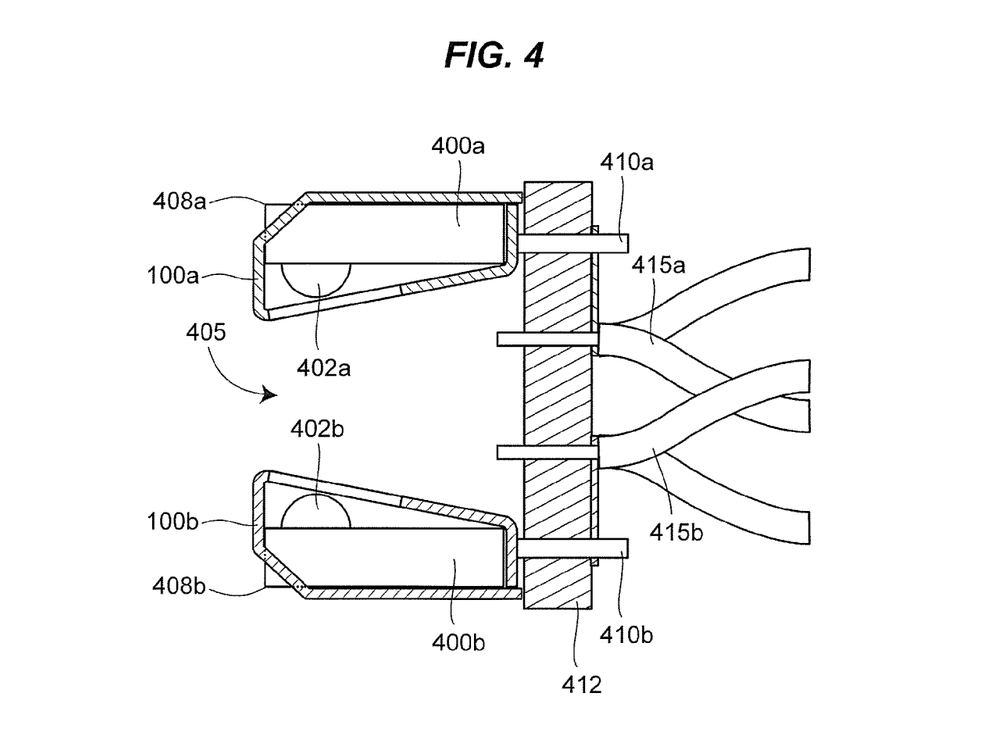
FIG. 4 depicts a side view of mounted photosensor IR components with an embodiment of secured aperture assemblies.

FIG. 4 depicts a side view of mounted photosensor IR components with secured aperture assemblies 100a and 100b. While this figure does not illustrate each distinct element of the aperture assemblies 100a, 100b, it does show the configuration of the attached aperture assemblies 100a, 100b to a pair of mounted photosensor IR components 400a and 400b. The aperture windows of the aperture assemblies 100a, 100b may be aligned tangentially to the domes 402a, 402b of the IR components 400a, 400b. The edges 408a, 408b created by the intersection of the pin-opposite and dome-opposite faces of IR components 400a, 400b may be secured by and protrude through the locator slots (not visible). Infrared radiation may be focused through the aperture window of the radiation-emitting component, may travel through the gap 405 between the IR components 100a, 100b, and may be received through the opposing aperture window at the radiation-detecting component. The pins 410a, 410b of the IR components 400a, 400b may be plugged into the corresponding receptacle 412 of the motor, thus allowing the photosensor system to be in electronic connection 415a, 415b with the control system of the motor. When a rotor travels through the gap 405, the slotted disk of the rotor may interrupt the infrared radiation for a time interval. This information may be conveyed by the photosensor system 400a, 400b via the electronic connections 415a, 415b to the control system of the motor.

Figure 5:
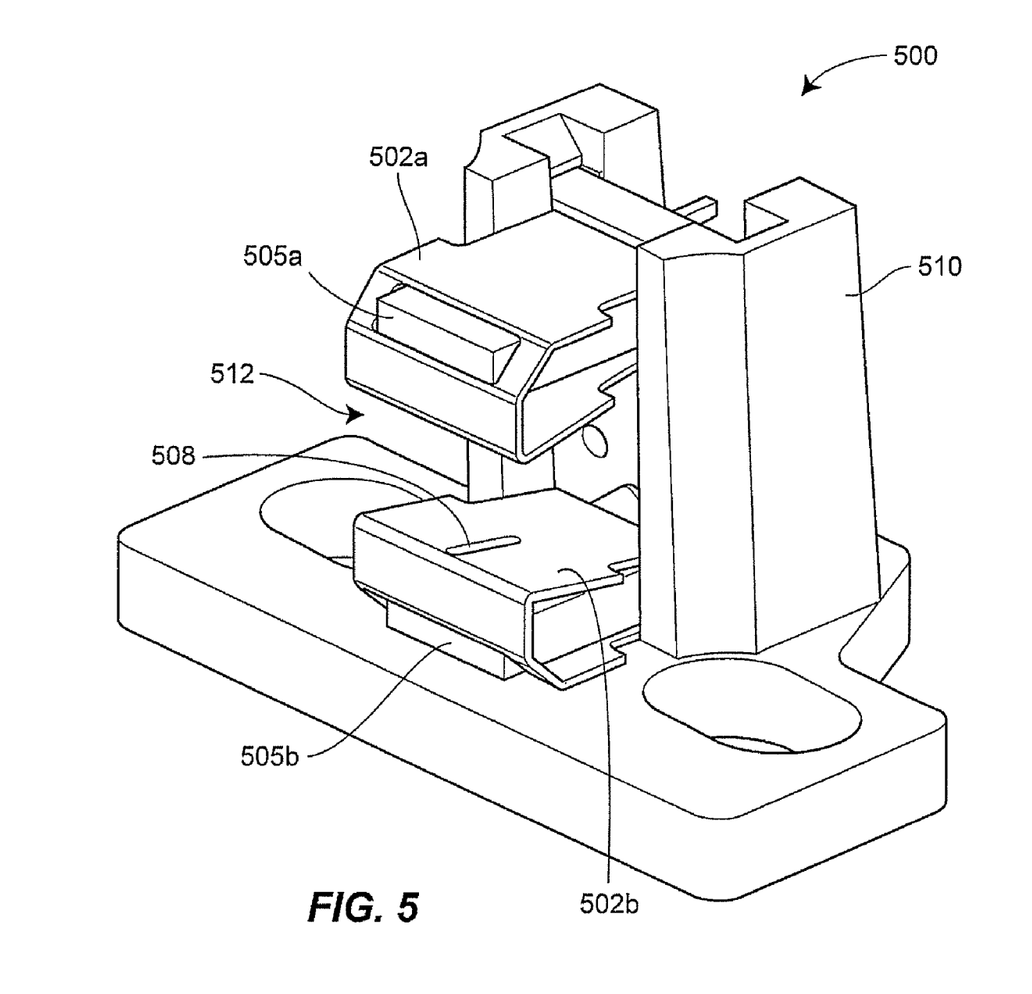
FIG. 5 shows a perspective view of an exemplary photosensor system with an embodiment of secured aperture assemblies.

FIG. 5 shows a perspective view 500 of an exemplary photosensor system with an embodiment of secured aperture assemblies. Secured aperture assemblies 502a, 502b may be wrapped and secured to infrared photosensor components 505a, 505b. In this view, the edges of the IR components are visible through the locator slots of the aperture assemblies 502a, 502b. The aperture window 508 of the lower IR component 505b is also visible. The IR components 505a, 505b may be received by the corresponding receptacle 510 by plugging the pins of the IR components 505a, 505b into receiving slots at the receptacle 508 (not visible). The gap 512 through which the slotted disk of a rotor may travel may be located between the secured aperture assemblies 502a, 502b.

Figure 6:
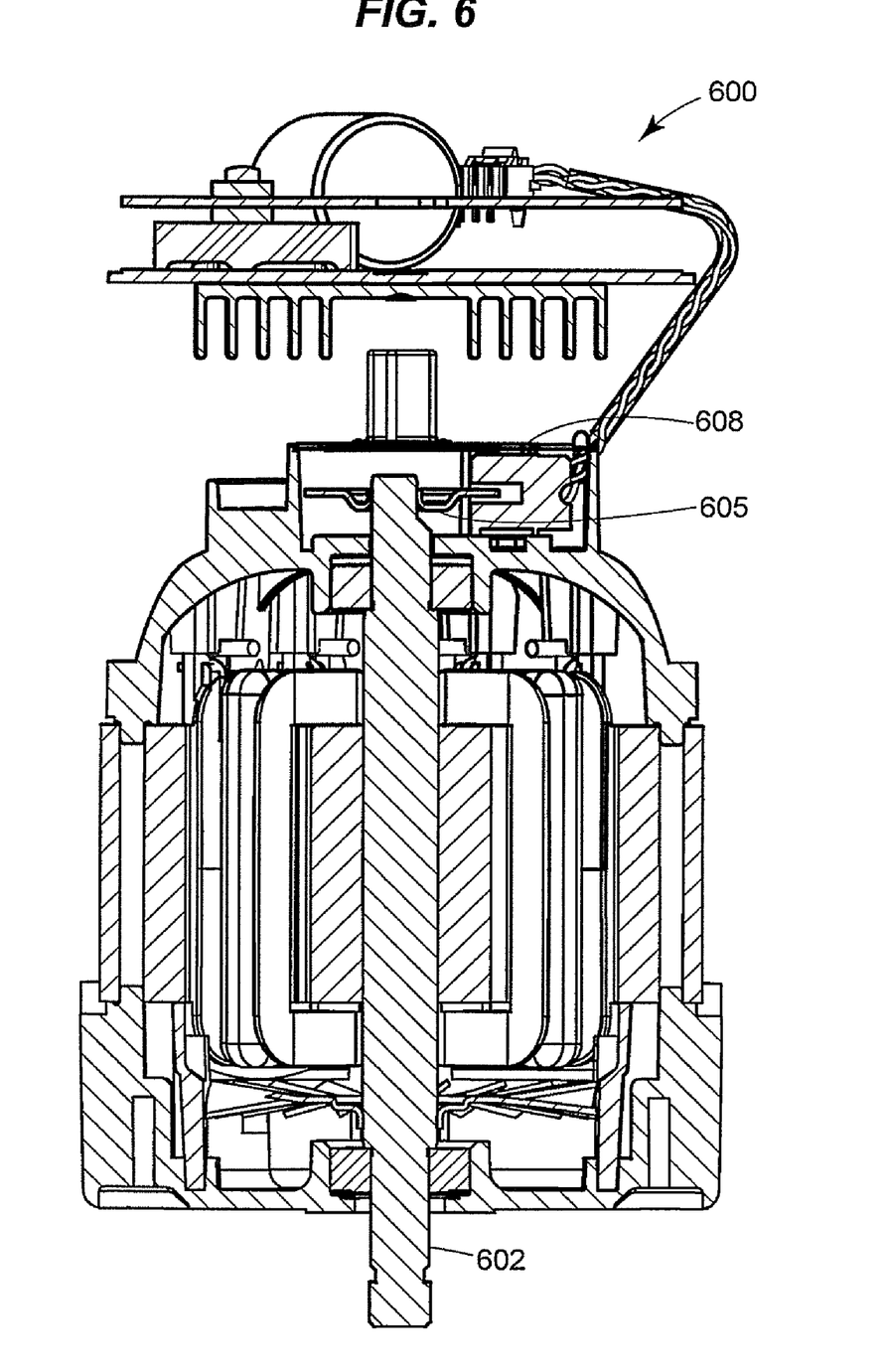
FIG. 6 illustrates a rotor-sensing system of a switched reluctance motor with the photosensor system having an embodiment of secured aperture assemblies.

FIG. 6 illustrates a rotor-sensing system of a switched reluctance motor 600 with the photosensor system having secured aperture assemblies. The switched reluctance motor 600 may include a shaft 602 and slotted disk 605 of the rotor. The photosensing system 608 may be attached to the motor 600 so that the slotted disk 605 of the rotor passes through the gap between the IR components. The gap may be bounded by IR emitting and IR detecting components wrapped by secured aperture assemblies, as illustrated by FIG. 5.

Figure 7:
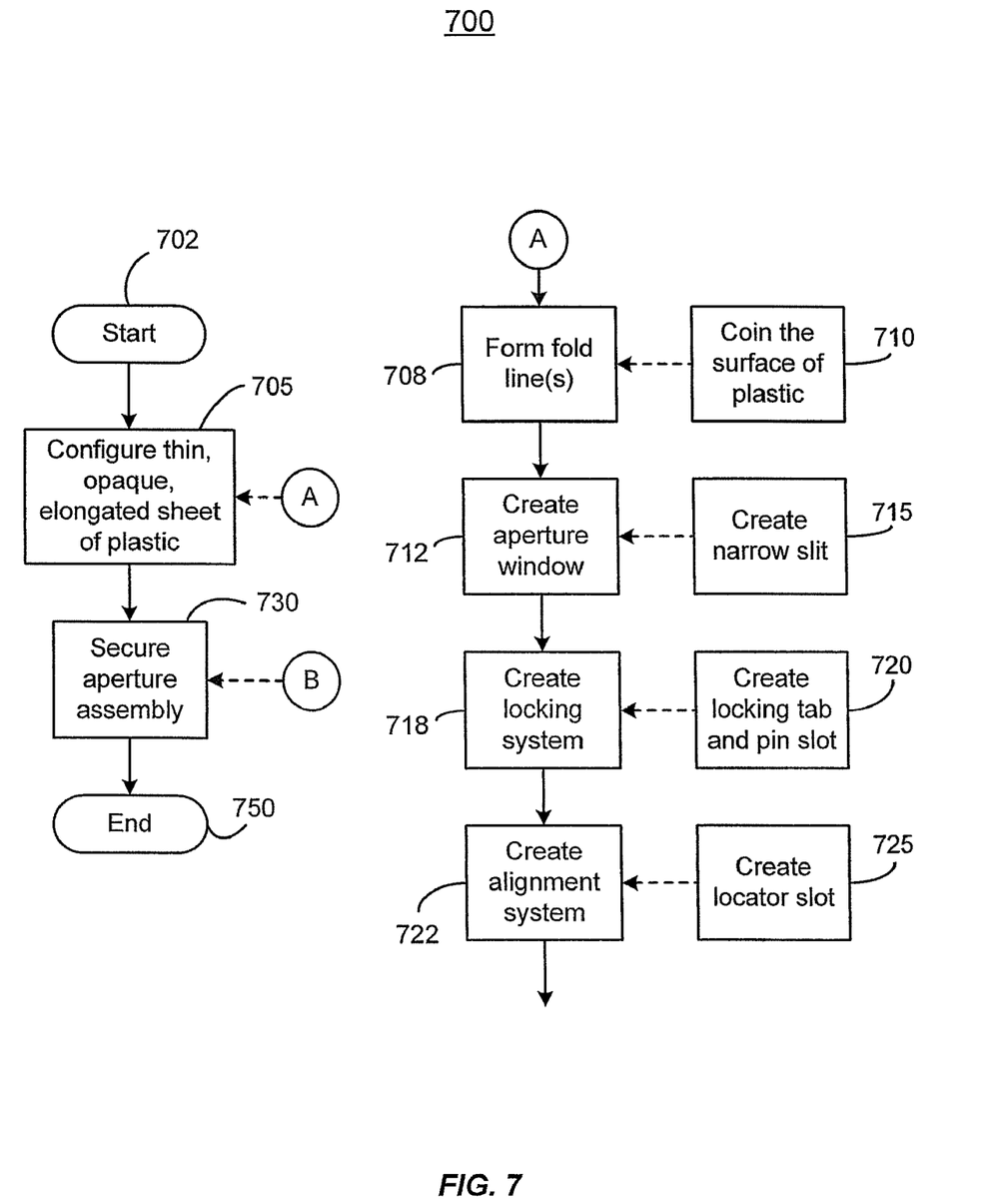
FIGS. 7 and 7a illustrate an exemplary method for providing a replaceable aperture assembly and securing it to an IR component of a photosensor system.
Figure 7A:
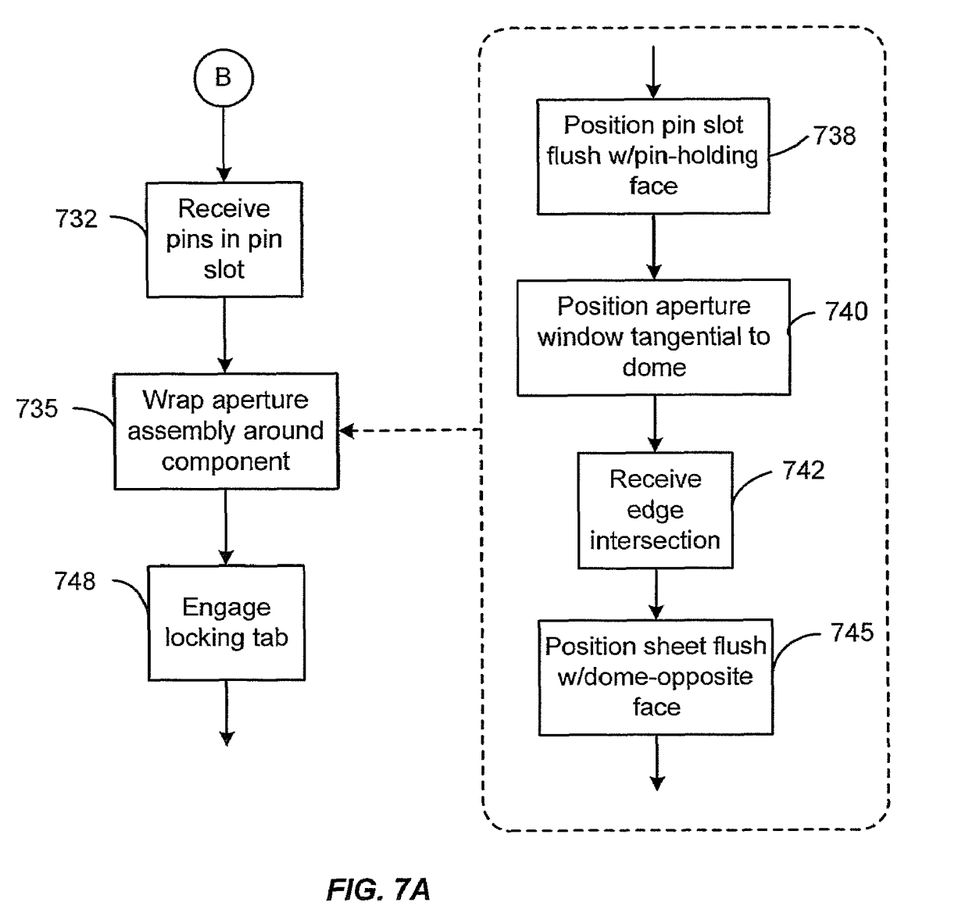

FIGS. 7 and 7a illustrate an exemplary method 700 for providing a replaceable aperture assembly and securing it to an IR component of a photosensor system. In FIG. 7 at the start (block 702) of method 700, a thin, opaque, elongated sheet of plastic may be configured (block 705). Configuring the sheet of plastic (block 705) may include forming one or more fold lines (block 708) by coining the surface of the plastic (block 710), creating an aperture window (block 712) by creating a narrow slit (block 715) sized to focus the infrared radiation with a required precision, creating a locking system (block 718) by creating a locking tab and a pin slot (block 720) at either end of the sheet of plastic, and creating an alignment system (block 722) by creating a locator slot (block 725) to receive an edge of the IR component resulting in the aperture window being securely and appropriately aligned over the dome of the IR component.

Next, the aperture assembly may be secured (block 730) by the steps shown in FIG. 7a. The pins of the IR component may be securely received (block 732) by the pin slot of the aperture assembly. The aperture assembly may be wrapped around the IR component (block 735) by positioning the pin slot flush against the pin-holding face of the IR component (block 738), positioning the aperture window tangential to the dome-holding face of the IR component (block 740), receiving the edge created by the intersection of the pin-opposite and dome-opposite faces of the IR component in the locking slot (block 742), and positioning the sheet of plastic flush against the dome-opposite face of the IR component (block 745). The locking tab may be engaged (block 748) by positioning the shaft between the pins of the IR component and positioning the head against the side of the pins opposite to the shaft, with the locking tab flush against the pin-slot. Returning to FIG. 7, the method 700 then may end (block 750).

Figure 8:
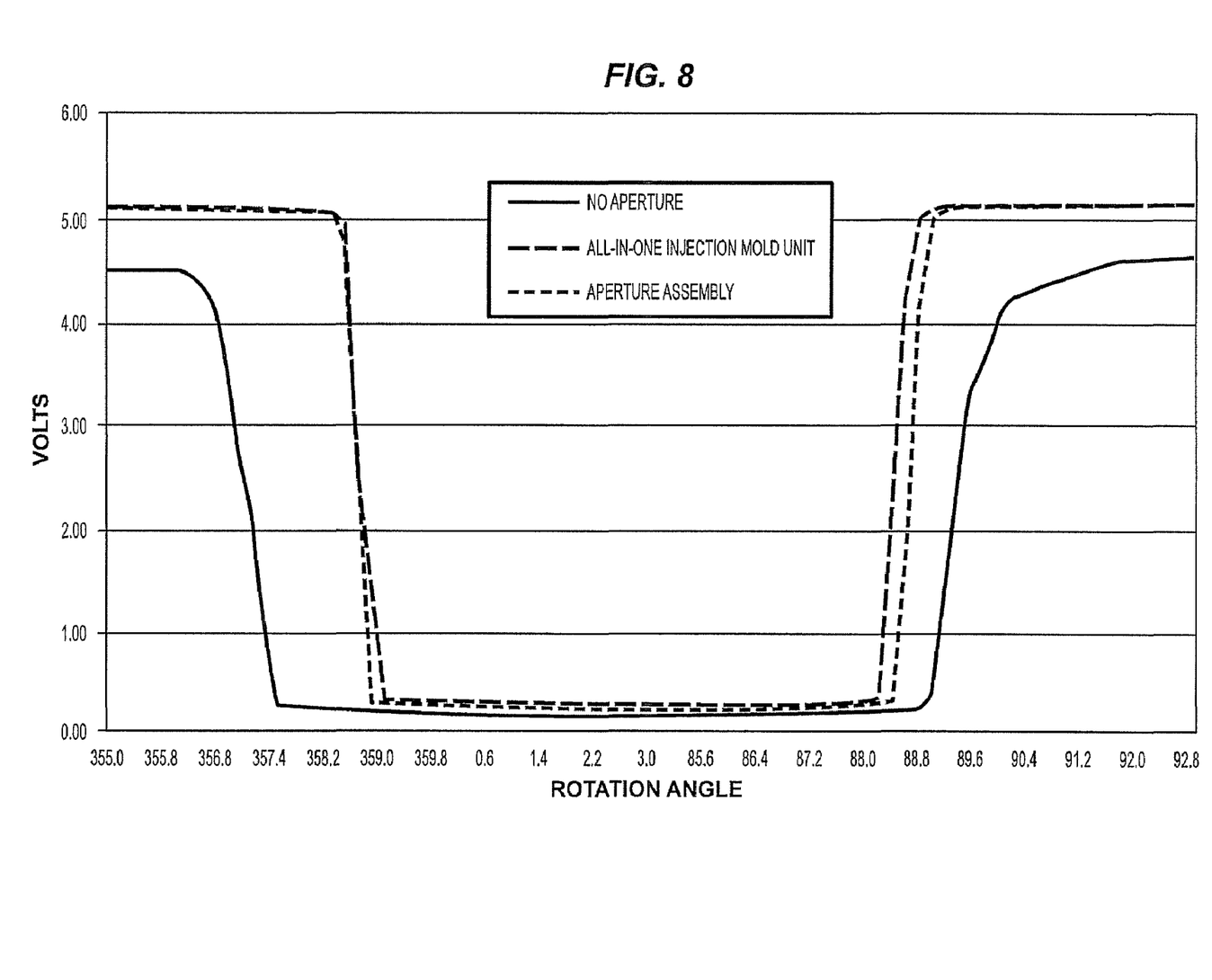
FIG. 8 illustrates the sensing capabilities of an exemplary embodiment of a photosensor system with a secured aperture assembly.

FIG. 8 illustrates the sensing capabilities of an exemplary embodiment of a photosensor system with a secured aperture assembly. In this embodiment, the aperture assembly may be stamped out of a polycarbonate film, such as GE 8020MA701. An off-the-shelf infrared radiation-emitting component such as Bright LED Electronics Corp.™ BIR-NM 23C1 or Honeywell™ SEP8506 may be used, and an infrared radiation-detecting component such as Bright LED Electronics Corp.™ BDT-NP03C1 or Honeywell™ SDP8406 may be used. The aperture may be wrapped around and secured to both the IR emitting and detecting components, and the IR components may be secured to the motor. The rotor may be varied through a range of rotation angles, and the resulting voltage from the photosensor system may be recorded for each rotation angle.

FIG. 8 shows the testing results for the exemplary aperture assembly embodiment, an all-in-one injection molded transmissive sensor, and an infrared radiation-emitting/infrared radiation-detecting component pair without an aperture assembly. The data demonstrates that the exemplary embodiment results in a voltage curve across a range of rotation angles similar to that of an all-in-one injection molded transmissive sensor. At the time of the testing, the cost of the IR components and aperture assembly in this embodiment was much less than the cost of the all-in-one injection molded transmissive sensor.

The invention has been described in terms of several preferred embodiments. It will be appreciated that the invention may otherwise be embodied without departing from the fair scope of the invention defined by the following claims.

What is claimed:

1. A stamped aperture assembly for use with a photosensor system and configurable to secure to an infrared (IR) component of the photosensor system, the infrared (IR) component comprising at least one of an infrared radiation-emitting component and an infrared radiation-detecting component, the stamped aperture assembly comprising:
   a thin, opaque, elongated sheet of plastic configured to wrap around the IR component;
   an aperture window to focus infrared radiation of the photosensor system;
   a locking system to attach the stamped aperture assembly, including a sagittally-shaped locking tab at a first end of the thin, opaque, elongated sheet of plastic and a pin slot at the opposite end,
      the pin slot shaped and sized to securely receive a set of pins of the IR component,
      a shaft of the sagittally-shaped locking tab sized to fit securely between the set of pins, and
      a head of the sagitally-shaped locking tab sized to rest on the set of pins;
   and
   an alignment system to direct the infrared radiation through the aperture window.

2. The stamped aperture assembly of claim 1, wherein the thin, opaque, elongated sheet of plastic comprises at least one fold line comprising a coined surface, the fold line oriented in a transverse fashion across a width of the sheet of plastic.

3. The stamped aperture assembly of claim 1, wherein the thin, opaque, elongated sheet of plastic comprises a material capable of filtering at least 90% of the infrared radiation of the photosensor system.

4. The stamped aperture assembly of claim 1, wherein the aperture window comprises a narrow slit in the thin, opaque, elongated sheet of plastic, the narrow slit having:
   a positioning along a longitudinal midline of the sheet of plastic,
   a width corresponding to a desired precision of optical sensing, and
   a length equivalent to at least the diameter of a dome of a sensor of the IR component; and
   wherein the sheet of plastic has a width along the length of the narrow slit so that if the sheet of plastic is wrapped around a first IR component of the photosensor system, the infrared radiation is enabled to reach a second IR component of the photosensor system via only the narrow slit.

5. The stamped aperture assembly of claim 1,
wherein the locking system is engaged if
   the pin slot securely receives the set of pins,
   an internal face of the pin slot is flush with a pin-holding face of the IR component,
   the thin, opaque, elongated sheet of plastic is wrapped around the IR component,
   the shaft of the locking tab fits between the set of pins and the head of the locking tab rests on a side of the set of pins opposite to the shaft, and
   an internal face of the locking tab is flush with an external face of the pin slot.

6. The stamped aperture assembly of claim 1, wherein the alignment system comprises a locator slot in the thin, opaque, elongated sheet of plastic centered along the longitudinal midline of the sheet and sized to receive an edge intersection of a pin-opposite face of the IR component and a sensor-opposite face of the IR component, so that if the edge intersection is received by the locator slot and the locking system is engaged, the aperture window is aligned over the sensor of the IR component.

7. The stamped aperture assembly of claim 1, wherein if the stamped aperture assembly is wrapped around and secured to the IR component, the aperture window is tangential to a dome of the sensor of the IR component, and an internal face of the sheet of plastic is flush with at least one non-sensor-holding face of the IR component.

8. The stamped aperture assembly of claim 1, wherein the locking system is configured to allow the stamped aperture assembly to be attached to or removed from the IR component by hand.

9. A removable stamped aperture assembly adapted to secure to an infrared (IR) component of a photosensor system for use with a rotor position sensor of a switched-reluctance motor, the IR component comprising at least one of an infrared radiation-emitting component and an infrared radiation-detecting component, comprising:
   an opaque, elongated sheet of plastic configured to wrap around the IR component;
   an aperture window to focus infrared radiation of the photosensor system;
   a locking system to secure the stamped aperture assembly to the IR component, including a sagittally-shaped locking tab at a first end of the opaque, elongated sheet of plastic and a pin slot at the opposite end,
      the pin slot shaped and sized to securely receive a set of pins of the IR component,
      a shaft of the sagittally-shaped locking tab sized to fit securely between the set of pins, and
      a head of the sagittally-shaped locking tab sized to rest on the set of pins; and
   an alignment system to direct the infrared radiation through the aperture window.

10. The removable stamped aperture assembly of claim 9, wherein the opaque, elongated sheet of plastic further comprises at least one fold line having a coined surface, the fold line oriented in a transverse fashion across a width of the sheet of plastic.

11. The removable stamped aperture assembly of claim 9, wherein the opaque, elongated sheet of plastic comprises a material capable of filtering at least 90% of the infrared radiation of the photosensor system.

12. The removable stamped aperture assembly of claim 9, wherein the aperture window comprises a narrow slit in the opaque, elongated sheet of plastic having:
    an orientation in a parallel fashion to a length of the sheet of plastic,
    a positioning along a longitudinal midline of the sheet of plastic,
    a width corresponding to a desired precision of optical sensing, and
    a length equivalent to at least the a diameter of a dome of a sensor of the IR component; and
    wherein the sheet of plastic has a width along the length of the narrow slit so that if the sheet of plastic is wrapped around a first IR component of the photosensor system, the infrared radiation is enabled to reach a second IR component of the photosensor system via only the narrow slit.

13. The removable stamped aperture assembly of claim 9, wherein the locking system is engaged if:
    the pin slot securely receives the set of pins,
    an internal face of the pin slot is flush with a pin-holding face of the IR component,
    the thin, opaque, elongated sheet of plastic is wrapped around the IR component,
    the shaft of the locking tab fits between the set of pins and the head of the locking tab rests on a side of the set of pins opposite to the shaft, and
    an internal face of the locking tab is flush with an external face of the pin slot.

14. The removable stamped aperture assembly of claim 9, wherein the alignment system comprises a locator slot in the opaque, elongated sheet of plastic centered along the longitudinal midline of the sheet and sized to receive an edge intersection of a pin-opposite face of the IR component and a sensor-opposite face of the IR component, wherein if the edge intersection is received by the locator slot and the locking system is engaged, the aperture window is positioned over the sensor of the IR component and is in alignment with an axis of a rotor sensed by the rotor position sensor.

15. The removable stamped aperture assembly of claim 9, wherein if the stamped aperture assembly is wrapped around and secured to the IR component, the aperture window is tangential to a dome of the sensor of the IR component and aligned with an axis of a rotor of the switched-reluctance motor, and an internal face of the sheet of plastic is flush with at least one non-sensor-holding face of the IR component.

16. A method of providing a replaceable aperture assembly and securing it to an infrared radiation (IR) component of a photosensor system comprising:
    configuring a thin, opaque, elongated sheet of plastic including
        forming at least one fold line along a coined surface, the fold line oriented in a transverse fashion across a width of the sheet of plastic, and
        creating an aperture window for focusing infrared radiation of the photosensor system;
    wrapping the replaceable aperture assembly around the IR component;
    aligning the replaceable aperture assembly on the IR component to direct the infrared radiation through the aperture window; and
    securing the replaceable aperture assembly to the IR component.

17. The method of claim 16, wherein configuring the thin, opaque, elongated sheet of plastic comprises stamping the sheet of plastic.

18. The method of claim 16, wherein configuring the thin, opaque, elongated sheet of plastic further comprises:
    creating the aperture window by creating a narrow slit in the thin, opaque elongated sheet of plastic, the narrow slit having an orientation in a parallel fashion to a length of the sheet of plastic, a positioning along a longitudinal midline of the sheet of plastic, a width corresponding to a desired precision of optical sensing, and a length at least the length of a diameter of a dome of a sensor of the IR component;
    creating a locking system by creating a sagittally-shaped locking tab at a first end of the thin, opaque, elongated sheet of plastic and a pin slot at the opposite end, the pin slot shaped and sized to securely receive a set of pins of the IR component, a shaft of the sagittally-shaped locking tab sized to fit securely between the set of pins, and a head of the sagittally-shaped locking tab sized to rest on the set of pins;
    creating an alignment system by creating a locator slot in the sheet of plastic centered along the longitudinal midline of the sheet and sized to receive an edge intersection of a pin-opposite face of the IR component and a sensor-opposite face of the IR component;
    configuring a length of the sheet of plastic so that if the pin slot securely receives the set of pins, and if the sheet of plastic is wrapped around and secured to the IR component, the shaft of the locking tab overlaps the pin slot and an internal face of the sheet of plastic is flush with at least one non sensor-holding face of the IR component; and
    configuring a width of the sheet of plastic so that if the sheet of plastic is wrapped around and secured to a first IR component, the infrared radiation is enabled to reach the second IR component via only the aperture window.

19. The method of claim 16, wherein securing the replaceable aperture assembly to the IR component comprises:
    creating a locking system by creating a sagittally-shaped locking tab at a first end of the thin, opaque, elongated sheet of plastic and a pin slot at the opposite end, the pin slot shaped and sized to securely receive a set of pins of the IR component, a shaft of the sagitally-shaped locking tab sized to fit securely between the set of pins, and a head of the sagittally-shaped locking tab sized to rest on the set of pins;
    receiving the set of pins in the pin slot so that an internal face of the pin slot is flush with a pin-holding face of the IR component; and
    wrapping the replaceable aperture assembly around the IR component so that
        an edge intersection of a pin-opposite face and a sensor-opposite face of the IR component is received securely by a locator slot,
        the aperture window is tangential to a dome of a sensor of the IR component,
        an internal face of the sheet of plastic is flush with at least one non-sensor-holding face of the IR component,
        the shaft of the locking tab fits securely between the set of pins,
        the head of the locking tab rests on a side of the set of pins opposite to the shaft, and
        an internal face of the locking tab is flush with an external face of the pin slot.

* * * * *